United States Patent [19]

Bolton, Jr. et al.

[11] Patent Number: 5,781,075
[45] Date of Patent: Jul. 14, 1998

[54] TEMPERATURE SENSING APPARATUS

[75] Inventors: Jerry T. Bolton, Jr.; Frederick L. Martin, both of Plantation, Fla.

[73] Assignee: Motorola, Inc., Schaumburg, Ill.

[21] Appl. No.: 742,989

[22] Filed: Nov. 1, 1996

[51] Int. Cl.$^6$ .................... G01K 7/01; H03L 1/02
[52] U.S. Cl. .................... 331/176; 327/513; 374/178
[58] Field of Search .................. 331/66, 176; 327/512, 327/513; 374/163, 172, 178, 183, 185

[56] References Cited

U.S. PATENT DOCUMENTS

| | | | |
|---|---|---|---|
| 4,577,149 | 3/1986 | Zbinden | 324/73 |
| 4,631,626 | 12/1986 | Bohan, Jr. | 361/104 |
| 4,652,144 | 3/1987 | Gunther et al. | 374/178 |
| 4,854,731 | 8/1989 | Jenkins | 374/178 |
| 5,119,265 | 6/1992 | Qualich et al. | 361/103 |
| 5,154,514 | 10/1992 | Gambino et al. | 374/178 |
| 5,351,013 | 9/1994 | Alidio et al. | 320/284 |
| 5,389,813 | 2/1995 | Schwob | 257/469 |
| 5,419,637 | 5/1995 | Frye et al. | 374/178 |

*Primary Examiner*—Siegfried H. Grimm
*Attorney, Agent, or Firm*—Andrew S. Fuller

[57] ABSTRACT

A temperature sensing apparatus (200), includes a temperature sensor (220), a current source (203), and a temperature independent voltage source (240, 250). The current source (203) provides a biasing current to the temperature sensor (220), and the voltage source (240, 250) is programmable to adjust the output of the temperature sensor (220). Preferably, the voltage source (240, 250) includes a variable current source (240) and a resistive element (250) with counterbalanced temperature coefficients, and the bias current source (203) is selected to have a counterbalancing temperature coefficient to that of the resistive element (250).

16 Claims, 3 Drawing Sheets ns apparatus

TEMPERATURE SENSING APPARATUS

TECHNICAL FIELD

This invention relates in general to temperature sensing devices, and more particular, to temperature sensors suitable for use in integrated circuits.

BACKGROUND OF THE INVENTION

In many electronic applications, accurate temperature sensors are needed to provide for compensation of temperature sensitive circuits. One such application involves temperature compensation of crystal reference oscillators used in wireless communications. It is particularly important that the frequency of a reference oscillator for a wireless device is correctly compensated over temperature, such that the wireless device can accurately transmit and receive specific frequencies. It is known in the art to provide a temperature sensing device that outputs a temperature dependent voltage. One example is described in U.S. Pat. No. 4,854,731, issued to Jenkins, on Aug. 8, 1989, for a temperature sensing apparatus. Here, a temperature sensing circuit uses diodes as temperature sensitive devices, and various characteristics of the diodes, such as current flow or turn on voltage, are used to determine the temperature of the diodes and thus the temperature of the immediate environment. In practical applications, the accuracy of such sensing circuits will depend on the circuit design, the quality of components used, and the accuracy of the manufacturing processes used to build the circuit.

Reference oscillators used in wireless communications generally use temperature compensation circuits which require accurate temperature information over a wide range of temperatures. While manufacturing processes may be improved to yield more accurate sensing circuits, manufacturing variations inevitably lead to conditions in which the accuracy of a sensing circuit may be affected. Moreover, operation conditions may lead to changes in the behavior of a sensing circuit. It is desirable to provide a temperature sensing circuit which may be adjusted to provide for calibration or changes in the operating environment. Therefore, a new temperature sensing apparatus is needed.

DETAILED DESCRIPTION OF THE PREFERRED EMBODIMENT

The present invention provides for a temperature sensing apparatus having adjustment capabilities for calibration and for other purposes. In the preferred embodiment, the temperature sensing apparatus includes a temperature sensing element that uses a constant current source to provide a biasing current, and a programmable and temperature independent voltage source to provide an adjustment voltage. Preferably, the voltage source has components with counterbalanced temperature coefficients to effect temperature independence, and the biasing current source has a temperature coefficient that counterbalances the temperature coefficient of elements of the voltage source to effect temperature independence.

Figure 1:
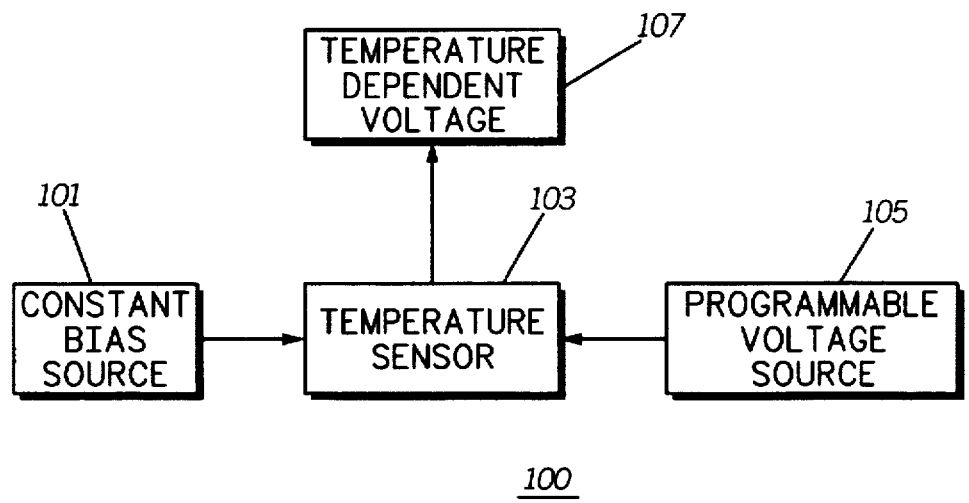
FIG. 1 is a block diagram of a temperature sensing apparatus, in accordance with the present invention.

FIG. 1 is a block diagram of a temperature sensing apparatus 100, in accordance with the present invention. The temperature sensing apparatus 100 includes a temperature sensor 103, that operates using a constant bias current source 101 and a programmable voltage source 105 as inputs. The temperature sensor 103 outputs and a temperature dependent voltage 107. Preferably, the voltage source 105 is adjustable, such as by programming, and is temperature independent. With this configuration, the output voltage 107 of the temperature sensor 103 can be adjusted as needed, such as for calibration and other purposes. For example, the temperature sensing apparatus 100 can be calibrated to output a specific voltage at a known temperature, such as room temperature.

Figure 2:
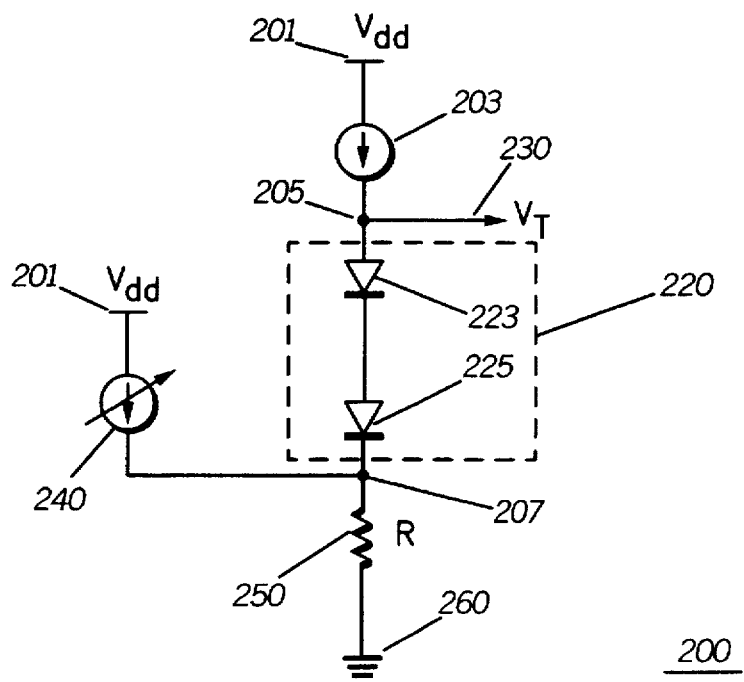
FIG. 2 is a circuit diagram of a particular embodiment of the temperature sensing apparatus of FIG. 1, in accordance with present invention.

FIG. 2 is a circuit diagram of an embodiment of the temperature sensing apparatus 200, in accordance with the present invention. The temperature sensing apparatus 200 includes a temperature sensing element 220, which in the preferred embodiment is formed by first and second diodes 223, 225, electrically connected in series such that the cathode of the first diode 223 is coupled to the anode of the second diode 225. Although two diodes are shown, the temperature sensing element 220 may be implemented using a single diode, multiple diodes, or other temperature sensitive device, such as a thermistor or similar semiconductor device. The temperature sensing element 220 has first and second terminals 205, 207. A constant current source 203, powered by a supply voltage 201, is electrically connected at the first terminal 205. The current source 203 supplies bias current to the diodes 223, 225. Preferably, the bias current source 203 has a constant value.

The temperature sensing apparatus 200 further includes a programmable or adjustable current source 240 that is powered by the supply voltage 201, and which is electrically connected at the second terminal 207. A resistor 250 coupling the temperature sensing element 220 to electrical ground 260 connects at the second terminal 207. The adjustable current source 240 and the resistor 250 in combination provide an adjustable or programmable voltage source. The programmable voltage source 240, 250 presents an adjustable voltage at the second terminal 207 which is used to adjust the output voltage 230 of the temperature sensing element 220.

In a further aspect of the present invention, the temperature coefficients of various components 203, 250, 240 are counterbalanced or offset so as to provide temperature independent operation. In the preferred embodiment, the temperature coefficient of the adjustable current source, and the temperature coefficient of the resistor are selected to have an inverse or counterbalancing relationship. Thus, the effect of temperature on the adjustable current source is canceled by the inverse effects of temperature on the resistor, such that a temperature independent voltage is presented at the second terminal 207 of the temperature sensing element 220. Additionally, the current source 203 is selected to have a temperature coefficient that is inverse to or counterbalances that of the resistor 250. Accordingly, the operation of the current source 203 and the resistor 250 is such that temperature independent operation is provided.

In short, the temperature sensing element 220 has an output 230 at its first terminal 205, which output is a temperature dependent voltage representing the temperature of the environment around the temperature sensing element. The adjustable voltage source 240, 250 coupled at the second terminal 207 is programmable to adjust the voltage seen at the second terminal 207, and consequently the voltage seen at the first terminal 205. In a preferred mode of operation, the programmable voltage source is used to adjust the output voltage 230 during calibration so as to present a particular voltage for a particular application.

Figure 3:
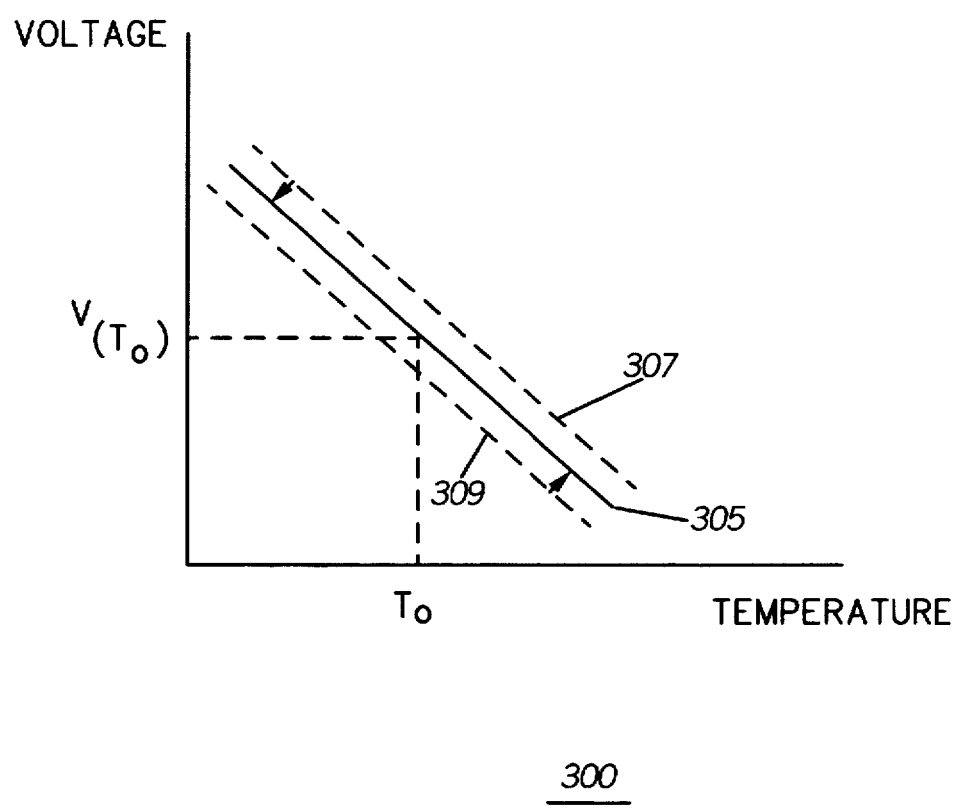
FIG. 3 is a graph highlighting the behavior of the temperature sensing apparatus of FIG. 1.

FIG. 3 shows a graph 300 depicting the voltage versus temperature response of the temperature sensing apparatus, in accordance with the present invention. The programmable voltage source is operated to adjust aberrant output voltage characteristics 307, 309 to a preferred output voltage characteristics 305 without affecting the temperature coefficient of the temperature sensing element, i.e., without changing the voltage to temperature slope.

Figure 4:
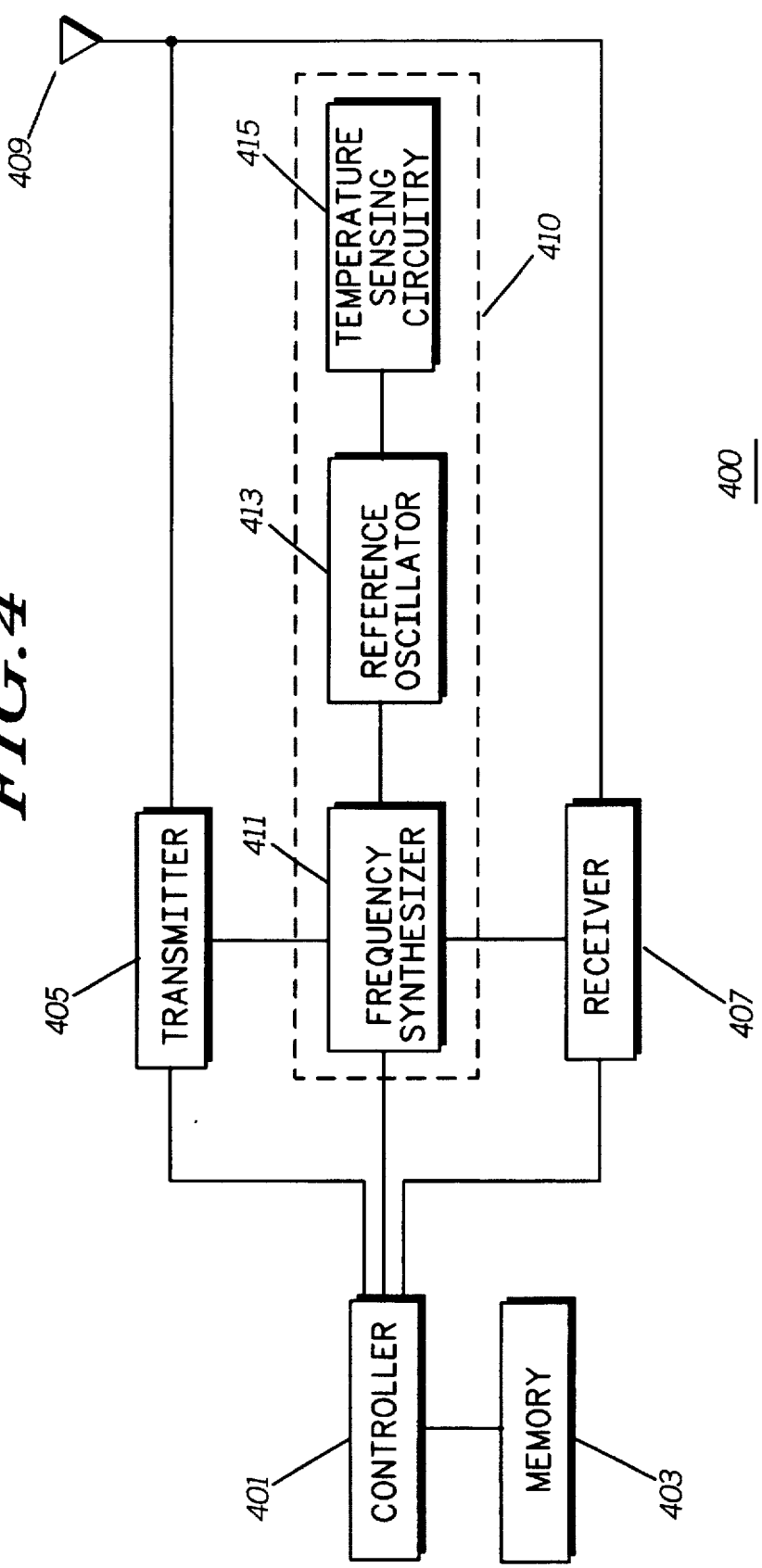
FIG. 4 is a block diagram of a radio communication device that employs the temperature sensing apparatus of FIG. 1, in accordance with the present invention.

FIG. 4 is a block diagram of a radio communication device 400, in accordance with the present invention. In the preferred embodiment, the communication device is a portable two-way radio operable to communicate over radio frequency channels. The radio 400 includes, as communication circuitry, a transmitter 405 and a receiver 407 which are coupled to an antenna 409. The transmitter 405 and receiver 407 operate under the control of a controller 401 according to instructions stored in a coupled memory 403. The controller 401 is further coupled to a frequency synthesizer 411 that provides frequency related information to the transmitter 405 and to the receiver 407. The frequency synthesizer 411 is in part based on a coupled reference oscillator 413. The reference oscillator 413 is temperature compensated according to temperature related information sourced from a coupled temperature sensing circuitry 415, which operates according to the present invention. The temperature sensing circuit provides an output voltage for compensating the reference oscillator. Preferably, the frequency synthesizer 411, the reference oscillator 413, and the temperature sensing circuitry 415 form part of an integrated circuit 410.

The present invention provides significant advantages over the prior art. The temperature sensing circuit is adjustable for calibration and for other purposes without significantly affecting the accuracy of the temperature sensing circuit. Under the design constraints of the present invention, a simplified yet effective temperature sensing circuit is afforded.

What is claimed is:

1. An apparatus for sensing temperature, comprising:

a temperature sensor having first and second terminals;

a constant current source coupled to the first terminal of the temperature sensor and providing a biasing current; and a voltage source coupled to the second terminal of the temperature sensor, wherein the voltage source is programmable and temperature independent.

2. The apparatus of claim 1, wherein the voltage source comprises:

an adjustable current source having a first temperature coefficient; and a resistor coupling the adjustable current source to electrical ground, the resistor having a second temperature coefficient that is inverse to the first temperature coefficient.

3. The apparatus of claim 2, wherein the constant current source has a temperature coefficient that is inverse to the second temperature coefficient.

4. The apparatus of claim 2, wherein the resistor and the adjustable current source are both connected to the second terminal of the temperature sensor.

5. The apparatus of claim 2, wherein the temperature sensor comprises at least one diode having an anode corresponding to the first terminal, and a cathode corresponding to the second terminal.

6. The apparatus of claim 2, wherein the temperature sensor comprises first and second diodes connected in series, the first diode having an anode corresponding to the first terminal, and the second diode having a cathode corresponding to the second terminal.

7. An integrated circuit, comprising:

a temperature sensor having first and second terminals, and comprising a diode with an anode coupled to the first terminal, and a diode with a cathode coupled to the second terminal, the temperature sensor having a temperature dependent voltage at the first terminal;

an adjustable current source coupled to the second terminal;

a resistor coupling the second terminal to ground; and a bias current source coupled to the first terminal.

8. The integrated circuit of claim 7, wherein:

the adjustable current source has a first temperature coefficient;

the resistor has a second temperature coefficient that counterbalances the first temperature coefficient; and the bias current source has a temperature coefficient that counterbalances the second temperature coefficient.

9. The integrated circuit of claim 7, wherein the adjustable current source is programmable.

10. The integrated circuit of claim 7, wherein the temperature sensor comprises first and second diodes coupled in series.

11. A radio, comprising:

communication circuitry;

a reference oscillator;

a temperature sensing circuit coupled to the reference oscillator, and providing an output voltage for compensating the reference oscillator, the temperature sensing circuit comprising:

a temperature sensor having first and second terminals, wherein the first terminal provides a temperature dependent voltage output;

a bias current source coupled to the first terminal of the temperature sensor; and a voltage source coupled to the second terminal of the temperature sensor, wherein the voltage source is programmable and temperature independent.

12. The radio of claim 11, wherein the voltage source comprises:

an adjustable current source having a first temperature coefficient; and a resistor coupling the adjustable current source to electrical ground, the resistor having a second temperature coefficient that is inverse to the first temperature coefficient.

13. The radio of claim 12, wherein the bias current source has a temperature coefficient that is inverse to the second temperature coefficient.

14. The radio of claim 13, wherein the resistor and the adjustable current source are both connected to the second terminal of the temperature sensor.

15. The radio of claim 14, wherein the temperature sensor comprises a diode having an anode corresponding to the first terminal, and a diode having a cathode corresponding to the second terminal.

16. A temperature sensor, comprising:

first and second diodes each having an anode and a cathode, the cathode of the first diode being coupled to the anode of the second diode;

a resistor electrically connecting the cathode terminal of the second diode to electrical ground;

an adjustable current electrically connected at the cathode of the second diode; and a bias current electrically connected to the anode of the first diode;

wherein the resistor has a particular temperature coefficient, and the adjustable current has a temperature coefficient that counterbalances the particular temperature coefficient of the resistor.

* * * * *